United States Patent
Fukui et al.

(10) Patent No.: US 11,084,072 B2
(45) Date of Patent: Aug. 10, 2021

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Shogo Fukui, Koshi (JP); Noritaka Uchida, Koshi (JP); Takanori Obaru, Koshi (JP); Hidetaka Shinohara, Koshi (JP); Shuuichi Nishikido, Koshi (JP); Tomohito Ura, Koshi (JP); Yuya Motoyama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/871,265

(22) Filed: Jan. 15, 2018

(65) Prior Publication Data
US 2018/0200764 A1     Jul. 19, 2018

(30) Foreign Application Priority Data
Jan. 17, 2017  (JP) .............................. JP2017-006052

(51) Int. Cl.
  *B08B 17/02*   (2006.01)
  *H01L 21/67*   (2006.01)
  (Continued)

(52) U.S. Cl.
  CPC ............ *B08B 17/025* (2013.01); *B08B 1/002* (2013.01); *B08B 1/02* (2013.01); *B08B 3/041* (2013.01);
  (Continued)

(58) Field of Classification Search
  CPC ......... H01L 21/67051; H01L 21/67046; H01L 21/67028; H01L 21/68728; H01L 21/6708;
  (Continued)

(56) References Cited

U.S. PATENT DOCUMENTS 6,062,852 A * 5/2000 Kawamoto ....... H01L 21/67109
432/258
2002/0096196 A1* 7/2002 Toshima ........... H01L 21/67051
134/21

(Continued)

FOREIGN PATENT DOCUMENTS

JP     H09-199458 A    7/1997
JP     2001-009386 A   1/2001
(Continued)

OTHER PUBLICATIONS

Nishikido et al., "Substrate processing apparatus", Aug. 2016, JP 2016-149470—Machine Translation (Year: 2016).*
(Continued)

*Primary Examiner* — David G Cormier
*Assistant Examiner* — Thomas Bucci
(74) *Attorney, Agent, or Firm* — Pearne & Gordon LLP

(57) ABSTRACT

Contamination of a bottom surface of a substrate caused by a processing liquid used for cleaning a top surface of the substrate can be suppressed. After performing a liquid processing on the top surface of the substrate and a liquid processing on the bottom surface of the substrate in parallel while rotating the substrate by a substrate holding/rotating unit, when stopping the liquid processing on the top surface of the substrate and the liquid processing on the bottom surface of the substrate, a control unit 18 stops a supply of the processing liquid onto the top surface of the substrate by a first processing liquid supply device 73, and then, stops a supply of the processing liquid onto the bottom surface of the substrate by a second processing liquid supply device 71.

5 Claims, 8 Drawing Sheets

(51) Int. Cl.

| | | |
|---|---|---|
| *H01L 21/687* | (2006.01) | |
| *H01L 21/02* | (2006.01) | |
| *B08B 1/00* | (2006.01) | |
| *B08B 1/02* | (2006.01) | |
| *B08B 3/04* | (2006.01) | |
| *B08B 5/02* | (2006.01) | |
| *B08B 7/04* | (2006.01) | |
| *F26B 21/14* | (2006.01) | |
| *F26B 3/04* | (2006.01) | |
| *F26B 5/08* | (2006.01) | |
| *B08B 3/08* | (2006.01) | |

(52) U.S. Cl.
CPC ............... *B08B 5/023* (2013.01); *B08B 7/04* (2013.01); *F26B 3/04* (2013.01); *F26B 21/14* (2013.01); *H01L 21/02043* (2013.01); *H01L 21/02052* (2013.01); *H01L 21/02096* (2013.01); *H01L 21/67017* (2013.01); *H01L 21/67046* (2013.01); *H01L 21/67051* (2013.01); *H01L 21/67173* (2013.01); *H01L 21/67253* (2013.01); *H01L 21/68728* (2013.01); *H01L 21/68735* (2013.01); *H01L 21/68764* (2013.01); *H01L 21/68785* (2013.01); *H01L 21/68792* (2013.01); *B08B 3/08* (2013.01); *F26B 5/08* (2013.01)

(58) Field of Classification Search
CPC ........... H01L 21/0209; H01L 21/67017; H01L 21/6715; H01L 21/68785; H01L 21/68707; H01L 21/6875
USPC .... 134/104.1, 902, 33, 18, 26, 153, 157, 32, 134/198, 1.3, 21, 34, 149, 95.3, 94.1, 134/95.1, 99.1
See application file for complete search history.

(56) References Cited

U.S. PATENT DOCUMENTS

| | | | | |
|---|---|---|---|---|
| 2005/0115671 | A1* | 6/2005 | Araki | H01L 21/67046 156/345.12 |
| 2006/0156981 | A1* | 7/2006 | Fondurulia | C23C 16/455 118/715 |
| 2007/0113872 | A1* | 5/2007 | Uchida | H01L 21/67051 134/26 |
| 2008/0189975 | A1* | 8/2008 | Miya | H01L 21/68728 34/317 |
| 2009/0090467 | A1* | 4/2009 | Lee | H01L 21/67051 156/345.23 |
| 2010/0319734 | A1* | 12/2010 | Minami | H01L 21/6708 134/26 |
| 2013/0152971 | A1* | 6/2013 | Kato | H01L 21/68728 134/21 |
| 2014/0261162 | A1* | 9/2014 | Yamaguchi | H01L 21/6715 118/52 |
| 2014/0271085 | A1* | 9/2014 | Gajendra | H01L 21/681 414/757 |
| 2014/0311532 | A1* | 10/2014 | Yokoyama | H01L 21/67051 134/33 |
| 2015/0258553 | A1* | 9/2015 | Kobayashi | H01L 21/68728 427/372.2 |
| 2015/0279708 | A1* | 10/2015 | Kobayashi | C23C 16/458 438/747 |
| 2016/0096205 | A1* | 4/2016 | Kato | H01L 21/68792 134/21 |
| 2016/0225644 | A1* | 8/2016 | Ishida | H01L 21/68728 |
| 2017/0056936 | A1* | 3/2017 | Nishiyama | H01L 21/67028 |
| 2017/0092530 | A1* | 3/2017 | Kaba | H01L 21/68792 |
| 2017/0092532 | A1* | 3/2017 | Kaba | H01L 21/67028 |
| 2017/0278727 | A1* | 9/2017 | Mouri | B08B 1/002 |
| 2018/0147599 | A1 | 5/2018 | Tanaka et al. | |

FOREIGN PATENT DOCUMENTS

| | | | | |
|---|---|---|---|---|
| JP | 2001-096238 A | | 4/2001 | |
| JP | 2002-219424 A | | 8/2002 | |
| JP | 2011-199012 A | | 10/2011 | |
| JP | 2013-058607 A | | 3/2013 | |
| JP | 2013058607 A | * | 3/2013 | ........ H01L 21/67046 |
| JP | 2015-153947 A | | 8/2015 | |
| JP | 2016-149470 A | | 8/2016 | |
| JP | 2016149470 A | * | 8/2016 | |
| TW | 2013-24654 A1 | | 6/2013 | |
| TW | 2016-43942 A | | 12/2016 | |

OTHER PUBLICATIONS

Mori et al. "Liquid processing apparatus and control method of the same", Mar. 2013, JP 2013-058607—Machine Translation (Year: 2013).*

* cited by examiner

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2017-006052 filed on Jan. 17, 2017, the entire disclosures of which are incorporated herein by reference.

TECHNICAL FIELD

The embodiments described herein pertain generally to a technique of performing a liquid processing by supplying a processing liquid onto a substrate.

BACKGROUND

In the manufacture of a semiconductor device, a cleaning processing may be performed on a top surface and a bottom surface of a substrate such as a semiconductor wafer by supplying a cleaning liquid (for example, a chemical liquid for cleaning or a rinse liquid) onto the top surface and the bottom surface of the substrate while rotating around a vertical axis the substrate which is horizontally held with a device formation surface thereof facing downwards. At this time, the top surface of the substrate may be cleaned physically by, for example, bringing a brush into contact with the top surface of the substrate (Patent Document 1).

Patent Document 1: Japanese Patent Laid-open Publication No. 2016-149470

However, the processing liquid supplied on the top surface of the substrate or mist of the processing liquid may be flown to the bottom surface of the substrate and adhere to the device formation surface which is the bottom surface. Since the adhered processing liquid may contain an unnecessary material such as a particle removed from the top surface of the substrate, the device formation surface may be contaminated.

SUMMARY

In view of the foregoing, exemplary embodiments provide a technique of suppressing contamination of a bottom surface of a substrate caused by a processing liquid used for cleaning a top surface of the substrate.

In one exemplary embodiment, there is provided a substrate processing apparatus configured to perform a liquid processing on a substrate by supplying a processing liquid onto the substrate. The substrate processing apparatus includes a substrate holding/rotating unit configured to hold and rotate the substrate; a first processing liquid supply device configured to supply the processing liquid onto a top surface of the substrate; a second processing liquid supply device configured to supply the processing liquid onto a bottom surface of the substrate; and a control unit configured to control processings using the first processing liquid supply device and the second processing liquid supply device. After performing the liquid processing on the top surface of the substrate and the liquid processing on the bottom surface of the substrate in parallel while rotating the substrate by the substrate holding/rotating unit, when stopping the liquid processing on the top surface of the substrate and the liquid processing on the bottom surface of the substrate, the control unit stops a supply of the processing liquid onto the top surface of the substrate by the first processing liquid supply device first, and after that, stops a supply of the processing liquid onto the bottom surface of the substrate by the second processing liquid supply device.

According to the exemplary embodiment, it is possible to suppress contamination of the bottom surface of the substrate caused by the processing liquid used for cleaning the top surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
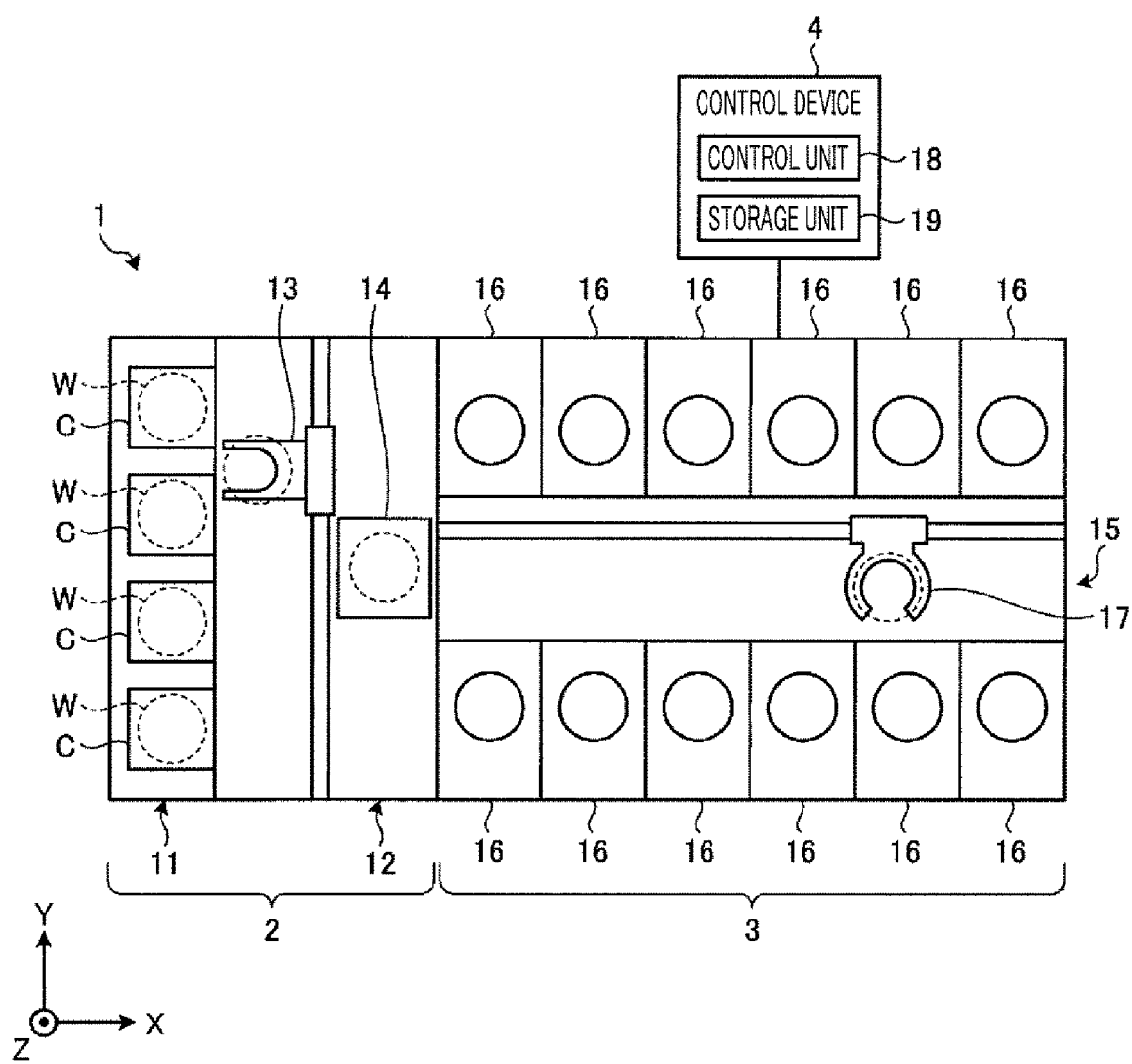
FIG. 1 is a plan view illustrating an outline of a substrate processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein Hereinafter, exemplary embodiments will be described with reference to the accompanying drawings.

First Exemplary Embodiment

FIG. 1 is a plan view illustrating an outline of a substrate processing system provided with a processing unit according to a first exemplary embodiment. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of wafers W (substrates) horizontally.

The transfer section 12 is provided adjacent to the carrier placing section 11, and provided with a first substrate transfer device 13 and a delivery unit 14. The first substrate transfer device 13 is provided with a substrate holding mechanism configured to hold a wafer W. Further, the first substrate transfer device 13 is movable horizontally and vertically and pivotable around a vertical axis, and transfers the wafers W between the carriers C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a second substrate transfer device 17 therein. The second substrate transfer device 17 is provided with a substrate holding mechanism configured to hold the wafer W. Further, the second substrate transfer device 17 is movable horizontally and vertically and pivotable around a vertical axis. The second substrate transfer device 17 transfers the wafers W between the delivery unit 14 and the processing units 16 by using the substrate holding mechanism.

The processing units 16 perform a predetermined substrate processing on the wafers W transferred by the second substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the first substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the second substrate transfer device 17 of the processing station 3 and carried into a processing unit 16.

The wafer W carried into the processing unit 16 is processed by the processing unit 16, and, then, carried out from the processing unit 16 and placed on the delivery unit 14 by the second substrate transfer device 17. After the processing of placing the wafer W on the delivery unit 14, the wafer W returns to the carrier C of the carrier placing section 11 by the first substrate transfer device 13.

Figure 2:
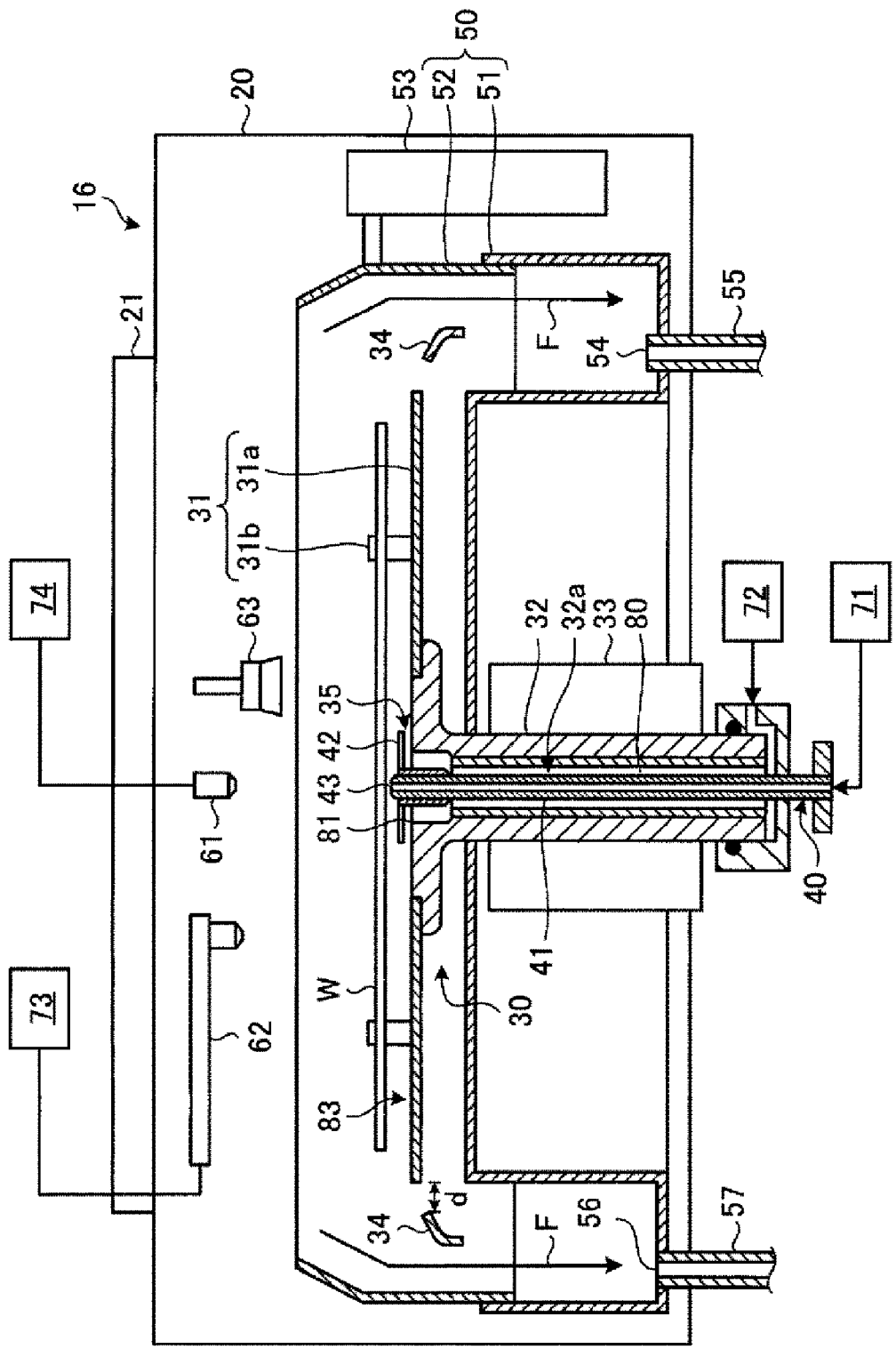
FIG. 2 is a schematic longitudinal cross sectional view of a processing unit belonging to the substrate processing system of FIG. 1.

Now, a schematic configuration of the processing unit 16 will be explained with reference to FIG. 2. FIG. 2 is a longitudinal cross sectional view schematically illustrating the processing unit 16 included in the substrate processing system of FIG. 1.

As illustrated in FIG. 2, the processing unit 16 is provided with a chamber 20, a substrate holding/rotating mechanism 30 (an example of a substrate holding/rotating unit) configured to hold and rotate a wafer W, a liquid discharge unit 40 constituting a processing liquid supply nozzle, and a recovery cup 50 configured to collect a processing liquid supplied onto the wafer W.

The chamber 20 accommodates therein the substrate holding/rotating mechanism 30, the liquid discharge unit 40 and the recovery cup 50. A fan filter unit (FFU) 21 is provided at the ceiling of the chamber 20. The FFU 21 forms a downflow in the chamber 20.

The substrate holding/rotating mechanism 30 is configured as a mechanical chuck which holds the wafer W with a mechanical clamp mechanism. The substrate holding/rotating mechanism 30 is provided with a substrate holding unit 31, a rotation shaft 32 and a rotation motor (rotation driving unit) 33.

The substrate holding unit 31 is provided with a circular base plate (plate-shaped body) 31a, and a plurality of supporting members 31b provided at a peripheral portion of the base plate 31a. The supporting members 31b are provided on the base plate 31a and hold a periphery of the wafer W. Accordingly, a space 83 is formed between a bottom surface of the wafer W and a top surface of the base plate 31a. In the present exemplary embodiment, some of the plurality of supporting members 31b are movable supporting members configured to be advanced towards or retracted from the wafer W to switch a hold and a release of the wafer W, and the rest of the supporting members 31b are non-movable supporting members. Details of the supporting members 31b will be described later. The rotation shaft 32 is hollow and is extended vertically downwards from a central portion of the base plate 31a. The rotation motor 33 is configured to rotate the rotation shaft 32, so that the wafer W horizontally held by the substrate holding unit 31 is rotated around a vertical axis line.

The liquid discharge unit 40 is formed as a vertically extended long narrow shaft-shaped member. The liquid discharge unit 40 has a vertically extended cylindrical hollow shaft portion 41 and a head portion 42. The shaft portion 41 is inserted in a cylindrical cavity 32a within the rotation shaft 32 of the substrate holding/rotating mechanism 30. The shaft portion 41 and the rotation shaft 32 are concentric. Formed between an outer surface of the shaft portion 41 and an inner surface of the rotation shaft 32 is a space having a circular ring-shaped cross section, and this space serves as a gas passageway 80.

The liquid discharge unit 40 has a vertically extended cylindrical cavity therein. A processing liquid supply line 43 is provided within this cavity. An upper end of the processing liquid supply line 43 is opened at the head portion 42 of the liquid discharge unit 40 and serves as a liquid discharge opening through which a processing liquid is discharged toward a central portion of the bottom surface of the wafer W held by the substrate holding/rotating mechanism 30.

A preset processing liquid for processing the bottom surface of the wafer W is supplied into the processing liquid supply line 43 from a second processing liquid supply device 71. A detailed configuration of the second processing liquid supply device 71 will be discussed later. In the present exemplary embodiment, the second processing liquid supply device 71 is configured to supply pure water (DIW). However, the second processing liquid supply device 71 may be configured to supply a plurality of processing liquids such as a chemical liquid (e.g., DHF) for cleaning and a rinse liquid while switching them. Nitrogen ($N_2$) as a drying gas for drying the bottom surface of the wafer W is supplied into the gas passageway 80 from a second drying gas supply device 72 (a second gas supply device). A detailed configuration of the second drying gas supply device 72 will be described later.

A neighbor of an upper portion (the head portion 42 and a lower side thereof) of the liquid discharge unit 40 is surrounded by the cavity 32a of the rotation shaft 32. A circular ring-shaped gap is provided between the upper portion of the liquid discharge unit 40 and the cavity 32a, and this gap forms a gas discharge path 81 which allows the drying gas to pass therethrough.

Formed on a top surface of the central portion of the base plate 31a is a gas discharge opening 35 which is confined by an edge of the head portion 42 of the liquid discharge unit 40 and a surface of the substrate holding unit. The gas discharge opening 35 is a circular ring-shaped discharge opening through which the gas flowing in the circular ring-shaped gas discharge path 81 is discharged into the space 83 (the space between the wafer W and the base plate 31a) under the wafer W.

The recovery cup 50 is disposed to surround the substrate holding unit 31 of the substrate holding/rotating mechanism 30, and is configured to collect the processing liquid scattered from the wafer W being rotated. The recovery cup 50 has a non-movable lower cup body 51; and an upper cup body 52 configured to be movable up and down between a raised position (shown in FIG. 2) and a lowered position. The upper cup body 52 is moved up and down by an elevating device 53. When the upper cup body 52 is located at the lowered position, an upper end of the upper cup body 52 is placed at a position lower than the wafer W held by the substrate holding/rotating mechanism 30. Accordingly, when the upper cup body 52 is located at the lowered position, the wafer W can be transferred between the substrate holding/rotating mechanism 30 and the substrate holding mechanism (arm) of the second substrate transfer device 17 (see FIG. 1) which is advanced into the chamber 20.

A gas exhaust port 54 is formed at a bottom portion of the lower cup body 51. An atmosphere collected within the recovery cup 50 is exhausted from the recovery cup 50 through this gas exhaust port 54. The gas exhaust port 54 is connected to a gas exhaust line 55, and the gas exhaust line 55 is connected to a factory exhaust system (not shown) having a decompressed atmosphere. Further, a drain port 56 is formed at the bottom portion of the lower cup body 51. The collected processing liquid is drained out from the recovery cup 50 through this drain port 56. The drain port 56 is connected to a drain line 57, and the drain line 57 is connected to a factory drain system (not shown).

A downflow of clean air from the FFU 21 is introduced into the recovery cup 50 through an upper opening of the recovery cup 50 (the upper cup body 52), and then, is exhausted from the gas exhaust port 54. As a result, an air flow as indicated by an arrow F is created within the recovery cup 50.

A flow rectifying member 34 has a ring shape. Further, the flow rectifying member 34 is configured to rectify and generate the air flow as indicated by the arrow F, and configured to suppress a blow up of a gas and mist toward the upper cup body 52 from the lower cup body 51. An upper end of the flow rectifying member 34 is located at a position lower than the base plate 31a and is spaced apart from an outer peripheral end of the base plate 31a at a distance d. In case that the wafer W has a size of 300 mm, it is desirable that the outer peripheral end of the base plate 31a is located at a side outer than an edge portion of the wafer W and the distance d is set to be about 4 mm. With this configuration, the function of the flow rectifying member 34 can be effectively exerted, and the particle adhesion to the bottom surface of the wafer W can be minimized.

The processing unit 16 is additionally equipped with at least one processing liquid supply nozzle 62 configured to supply a processing liquid (a chemical liquid for cleaning and a rinse liquid) onto the top surface of the wafer W held by the substrate holding/rotating mechanism 30. The processing unit 16 is further equipped with a brush 63 configured to scrub-clean the top surface of the wafer W. Details of a shape of the brush 63 will be explained later.

A predetermined processing liquid for processing the top surface of the wafer W is supplied to the processing liquid supply nozzle 62 from a first processing liquid supply device 73. A gas supply port 61 is provided above a rotation center of the wafer W, and $N_2$ as the drying gas for performing a drying processing is supplied from a first drying gas supply device 74. A detailed configuration of the first processing liquid supply device 73 and the first drying gas supply device 74 will be described later.

Figure 3A:
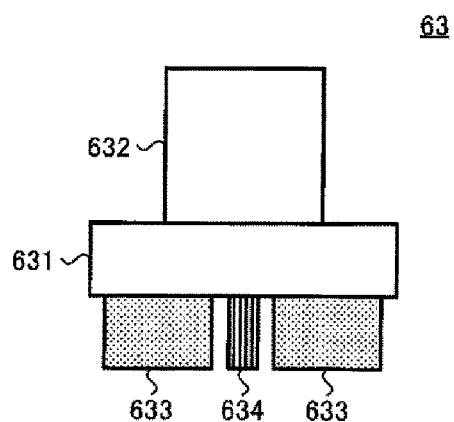
FIG. 3A to FIG. 3D are diagrams illustrating details of a shape of a brush.

Now, details of the shape of the brush 63 according to the present exemplary embodiment will be explained with reference to FIG. 3A to FIG. 3D, which provide diagrams illustrating details of the shape of the brush 63. FIG. 3A is a side view of the brush 63 according to the present exemplary embodiment, and FIG. 3B is a bottom view of the brush 63 according to the present exemplary embodiment.

Figure 3B:
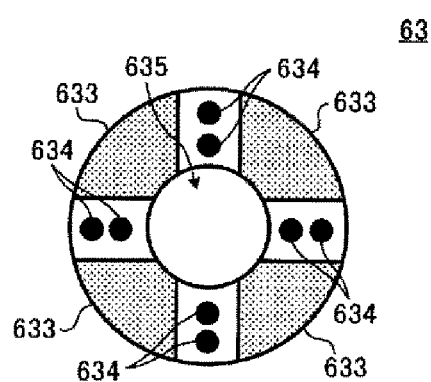

As depicted in FIG. 3A and FIG. 3B, the brush 63 includes a main body portion 631, a connecting portion 632, a first cleaning body 633, and a second cleaning body 634. The processing unit 16 is equipped with a non-illustrated arm configured to rotate the brush 63 and change a relative position of the brush 63 with respect to the wafer W. The connecting portion 632 is configured to connect the arm and the main body portion 631 to apply a rotational force thereto. The first cleaning body 633 and the second cleaning body 634 are configured to clean the wafer W by being brought into contact with the top surface of the wafer W, so that unnecessary material such as a particle or the like are removed. The first cleaning body 633 is a sponge-shaped cleaning body made of, but not limited to, PVA. The second cleaning body 634 is a cleaning body of a transplanted hair type and is made of a material (e.g., PP) which is harder than the material of the first cleaning body 633. The main body portion 631 and the connecting portion 632 has hollow cylindrical shapes, and a cleaning liquid discharged from a tip end of a supply line provided in the non-illustrated arm is introduced into an opening 635 through the hollow spaces.

Then, this processing liquid is supplied onto a contact surface between the first and second cleaning bodies 633 and 634 and the wafer W.

Figure 3C:
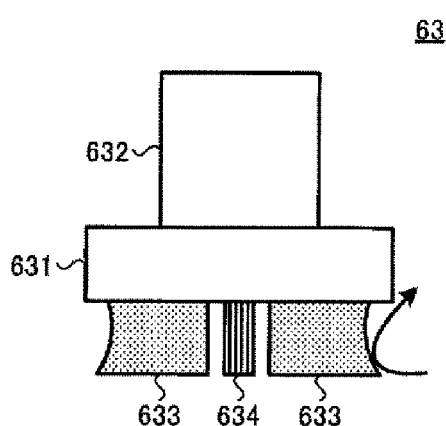

Since the first cleaning body 633 is made of the sponge-shaped material, side surfaces thereof may be bent inwards as shown in FIG. 3C when the brush 63 is in contact with the wafer W in a state that the brush 63 is wet with the processing liquid. The inventors have conjectured that this deformation is caused by a formation manner of the first cleaning body 633 in the manufacture of the brush 63. Further, since a friction force in a transversal direction is generated by a contact in which a pressing force of the first cleaning body 633 to the surface of the wafer W is applied, the degree of the deformation is increased during a liquid processing.

With the above-described inward bending, the cleaning liquid, which has collided with the side surfaces of the first cleaning body 633, may be easily splashed up diagonally upwards by a centrifugal force caused through the rotation thereof, as depicted in FIG. 3C, so that the mist of the processing liquid is increased. The mist splashed into an atmosphere may even reach and adhere to the bottom surface of the wafer W as well as the top surface thereof, resulting in contamination of the device formation surface.

Figure 3D:
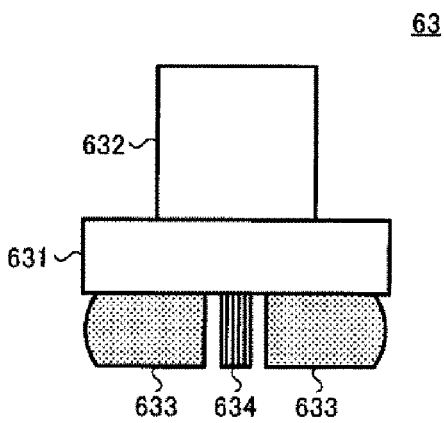

To solve this problem, as shown in FIG. 3D, it may be desirable to form the first cleaning body 633 such that the first cleaning body 633 has a shape according to an outward direction even in a state before it is used for the cleaning processing. To be specific, it may be desirable to form the first cleaning body 633 such that a peripheral portion of the first cleaning body 633 is bent outwards when viewed from the side.

Accordingly, the first cleaning body 633 may not be deformed as shown in FIG. 3C even when it is actually used. Therefore, the generation of the mist can be suppressed, and contamination of the device formation surface can be further suppressed.

FIG. 4A to FIG. 4D are diagrams for describing details of the substrate holding unit 31. Here, among the plurality of supporting members 31b, the movable supporting members are illustrated as grip members 31b-1 and the non-movable supporting members are illustrated as wafer supporting members 31b-2.

Figure 4A:
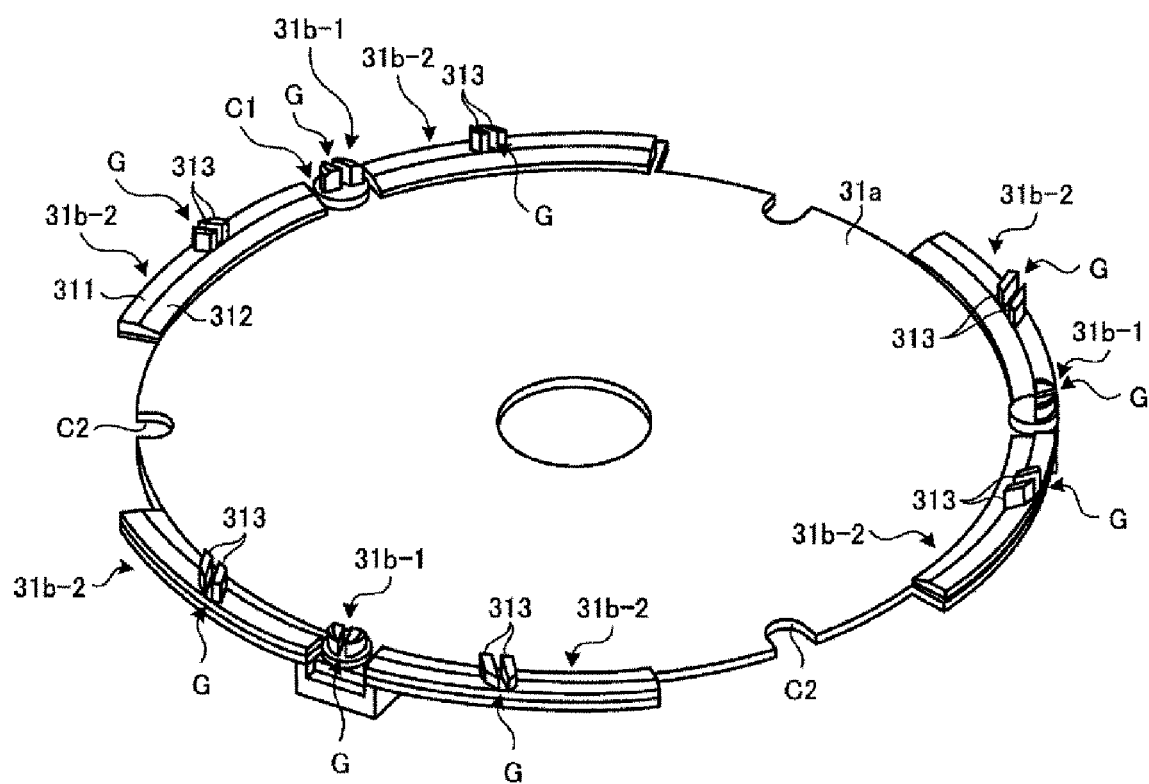
FIG. 4A is a diagram illustrating details of a substrate holding unit.

As shown in FIG. 4A, the base plate 31a has a substantially circular top surface and is provided with notches C1 and C2 along an edge thereof. The notches C1 and C2 are arranged alternately at an angular distance of about 60°. The notches C1 allow the grip members 31b-1 mounted under the base plate 31a to be protruded above the base plate 31a. Further, the notches C2 are provided to correspond to wafer holding claws (not shown) provided at the substrate holding mechanism of the second substrate transfer device 17 and allow the wafer holding claws to pass through the base plate 31a up and down.

Further, as described above, the multiple wafer supporting members 31b-2 extended along the peripheral portion of the based plate 31a are provided on the top surface of the base plate 31a. These wafer supporting members 31b-2 are formed to correspond to the notches C1 and C2 of the base plate 31a. Further, each wafer supporting member 31b-2 has a top surface flat portion 311; and an inclined surface 312 inclined toward a center of the base plate 31a. An outer edge of the inclined surface 312 (that is, a border between the top surface flat portion 311 and the inclined surface 312) lies along the circumference of a first circle having a larger diameter than the wafer W, and an inner edge of the inclined surface 312 lies along the circumference of a second circle which is concentric with the first circle and has a smaller diameter than the wafer W. Accordingly, when placing the wafer W on the base plate 31a, the wafer W is held with its edge being in contact with the inclined surfaces 312 (see FIG. 4B). At this time, the wafer W is maintained spaced apart from the top surface of the base plate 31a.

Figure 4B:
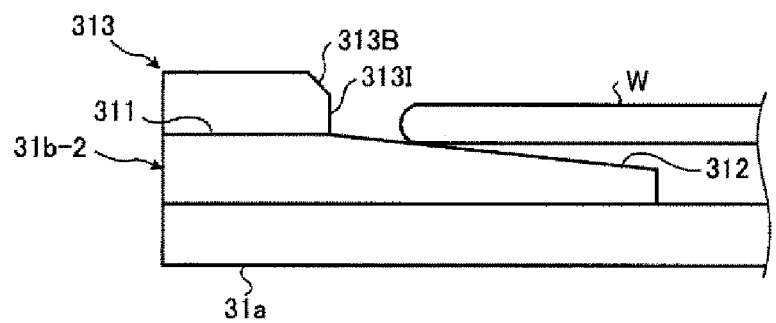
FIG. 4B is a diagram illustrating details of the substrate holding unit.

Moreover, a guide pin 313 is provided at the top surface flat portion 311 of each wafer supporting member 31b-2. As illustrated in FIG. 4B, a lower end of a side surface 3131 of the guide pin 313 is in contact with the outer edge of the inclined surface 312 of the wafer supporting member 31b-2. Further, the guide pin 313 is provided with an inclined guide surface 313B which is inclined toward the center of the base plate 31a. When the wafer W is placed on the wafer supporting member 31b-2 from the second substrate transfer device 17 (see FIG. 1), if the edge of the wafer W comes into contact with the inclined guide surface 313B, the edge of the wafer W would be guided to slide down the inclined guide surface 313B. As a result, the wafer W is moved and a position thereof is determined to be properly supported by the wafer supporting member 31b-2.

Further, the guide pin 313 has a height which allows a top surface of the guide pin 313 to be located higher than the top surface of the wafer W which is supported by the plurality of wafer supporting members 31b-2.

Figure 4C:
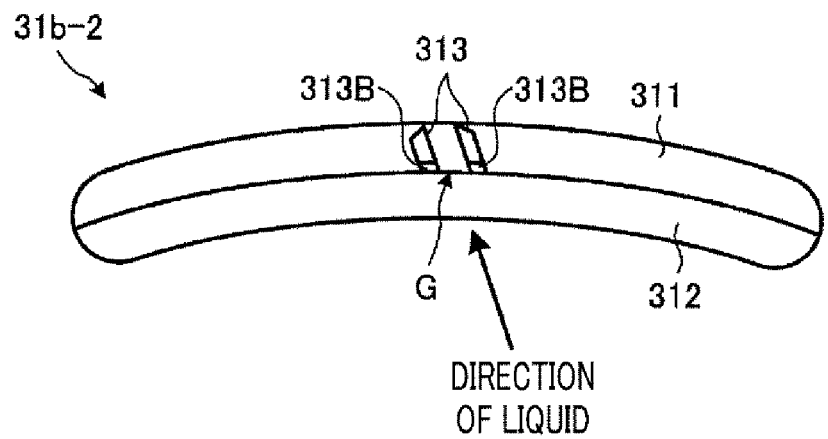
FIG. 4C is a diagram illustrating details of the substrate holding unit.
Figure 4D:
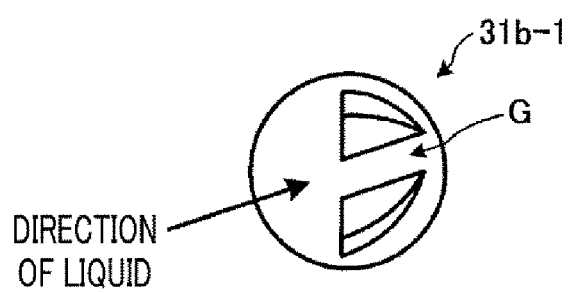
FIG. 4D is a diagram illustrating details of the substrate holding unit.

FIG. 4C and FIG. 4D are diagrams respectively illustrating the guide pin 313 and the grip member 31b-1 viewed from the top. As shown in the drawings, a groove G extended in a direction intersecting with the periphery of the base plate 31a is formed at a substantially central portion of each of the guide pin 313 provided at the wafer supporting member 31b-2 and the grip member 31b-1. These grooves G are not accurately oriented to a radial direction but inclined in a direction of the cleaning liquid flowing on the periphery of the wafer W during the liquid processing. Thus, the amount of the processing liquid which collides with the guide pin 313 from the transversal direction can be reduced, so that the effect of suppressing the mist generation can be further enhanced.

Figure 4E:
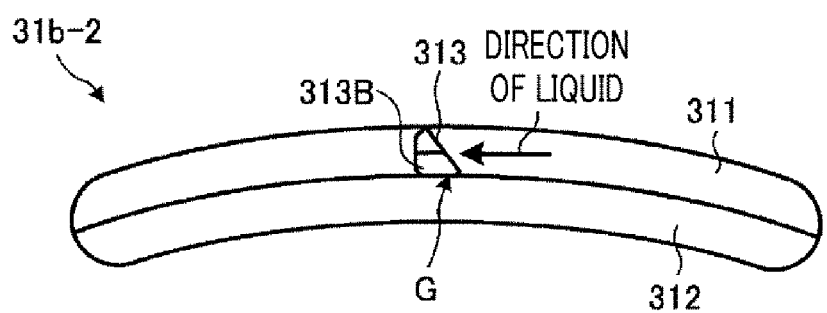
FIG. 4E is a diagram illustrating details of the substrate holding unit.

FIG. 4E shows a modification example of the guide pin 313. The direction of the liquid flowing toward the guide pin 313 may vary depending on such a condition as a rotational speed or the like in the liquid processing. FIG. 4E shows a configuration optimized for a case where the liquid flows in a substantially circumferential direction. Since an inclined surface of the guide pin 313 faces outwards, the processing liquid which has once collided with the guide pin 313 does not splash back towards the wafer W but most of it is guided into the recovery cup 50. Though this inclination is formed by notching the entire guide pin 313, since an inclined guide surface 313B maintains a shape similar to an original shape, it can serve as a guiding member of the wafer W sufficiently. Further, though the above example has been described for a case where a length of the top surface flat portion 311 is sufficiently larger than a size of the guide pin 313 when viewed from the top, the top surface flat portion 311 may be provided only at a periphery of the guide pin 313 or may be even omitted. Even in such a case, the same effect can still be obtained.

Figure 5:
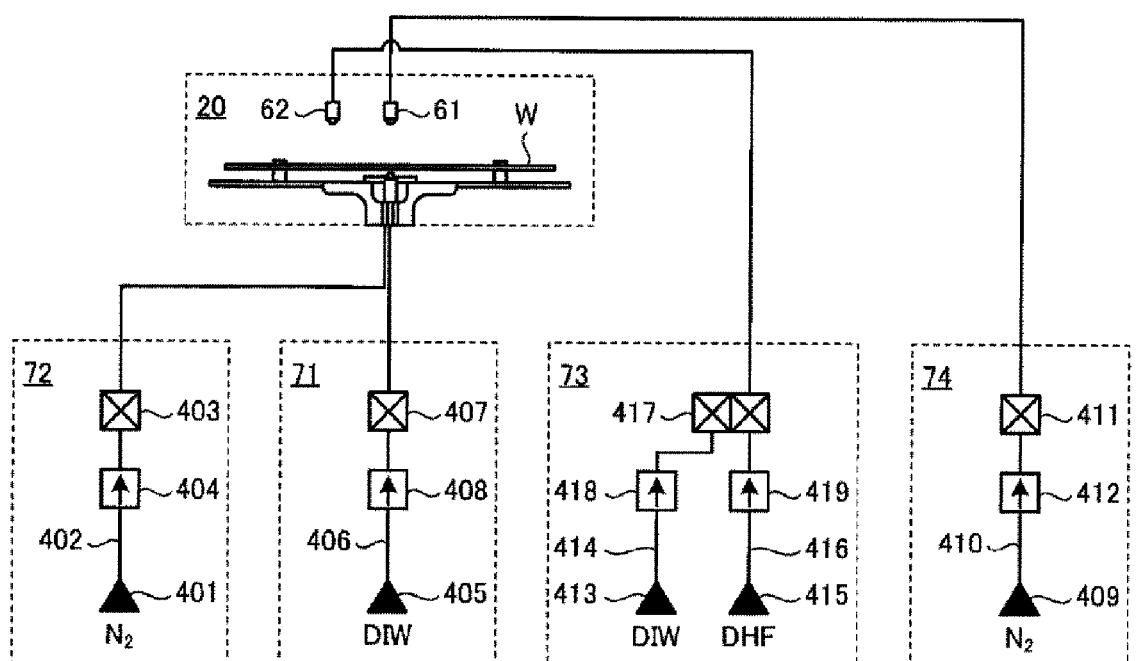
FIG. 5 is a diagram illustrating a configuration of a fluid supply system.

In the present exemplary embodiment, a configuration of a fluid supply system configured to supply and drain/exhaust a processing liquid and a drying gas of the substrate processing system 1 is illustrated in FIG. 5. FIG. 5 is a diagram illustrating a configuration of the fluid supply system.

In the second drying gas supply device 72 of FIG. 5, a drying gas supply source 401 is a source of the drying gas ($N_2$) for the drying processing. A drying gas supply line 402 is a supply path for supplying the drying gas from the drying gas supply source 401 into the chamber 20. An opening/closing valve 403 is provided at the drying gas supply line 402 and is configured to control a start and a stop of the supply of the drying gas into the chamber 20. A flow rate controller 404 is provided at the drying gas supply line 402 and is configured to control a flow rate of the drying gas supplied into the chamber 20 from the drying gas supply line 402.

In the second processing liquid supply device 71 (a second processing liquid supply device) of FIG. 5, a processing liquid supply source 405 is a source of a processing liquid for the liquid processing. In the present exemplary embodiment, the processing liquid supply source 405 is a source of pure water (DIW) as the processing liquid. A processing liquid supply line 406 is a supply path for supplying the processing liquid from the processing liquid supply source 405 into the chamber 20. An opening/closing valve 407 is provided at the processing liquid supply line 406 and is configured to control a start and a stop of the supply of the processing liquid into the chamber 20. A flow rate controller 408 is provided at the processing liquid supply line 406 and is configured to control a flow rate of the processing liquid supplied into the processing liquid supply line 406 from the processing liquid supply source 405.

The first drying gas supply device 74 of FIG. 5 has the same configuration as the second drying gas supply device 72. In the first drying gas supply device 74, a drying gas supply source 409 has the same function as the drying gas supply source 401; a drying gas supply line 410 has the same function as the drying gas supply line 402; an opening/closing valve 411 has the same function as the opening/closing valve 403; and a flow rate controller 412 has the same function as the flow rate controller 404.

In the first processing liquid supply device 73 (a first processing liquid supply device) of FIG. 5, a processing liquid supply source 413 has the same function as the processing liquid supply source 405, and a processing liquid supply line 414 has the same function as the processing liquid supply line 406. A processing liquid supply source 415 is a source of a DHF as the processing liquid according to the present exemplary embodiment. A processing liquid supply line 416 is a supply path for supplying the processing liquid from the processing liquid supply source 415 to the chamber 20. A switching valve 417 is connected to the processing liquid supply line 414 and the processing liquid supply line 416. The switching valve 417 is configured to perform a switchover to allow either one of the DIW and the DHF to be supplied into the chamber 20 and control a start and a stop of the supply of the corresponding processing liquid. A flow rate controller 418 is provided at the processing liquid supply line 414 and is configured to control a flow rate of the processing liquid supplied from the processing liquid supply source 413 via the processing liquid supply line 414. A flow rate controller 419 is provided at the processing liquid supply line 416 and is configured to control a flow rate of the processing liquid supplied from the processing liquid supply source 415 via the processing liquid supply line 416.

Figure 6A:
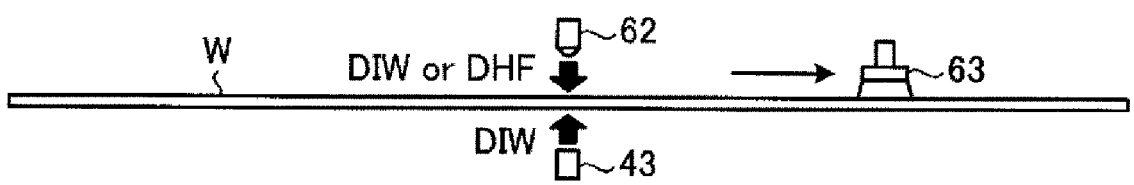
FIG. 6A to FIG. 6C are diagrams for describing operations when a cleaning processing and a drying processing are performed.
Figure 6B:
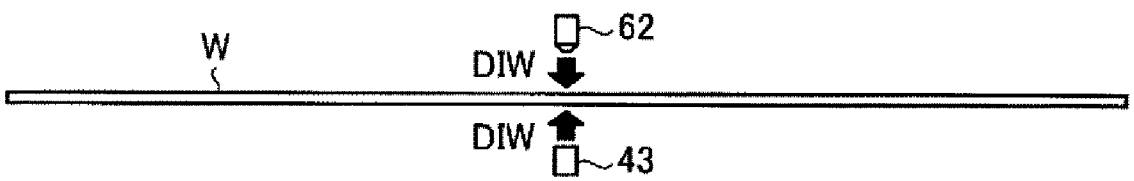
Figure 6C:
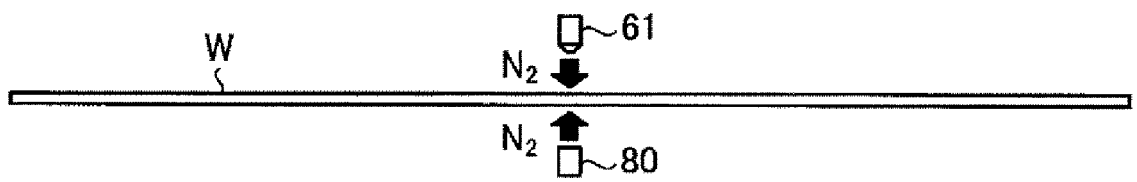

Now, in the cleaning processing and the drying processing, an operation of the substrate processing apparatus according to the present exemplary embodiment will be explained with reference to FIG. 6A to FIG. 6C. FIG. 6A to FIG. 6C are diagrams for describing operations when the cleaning processing and the drying processing are performed.

In the present exemplary embodiment, both a top surface and a bottom surface of a wafer W having a radius of 150 mm are processed in parallel, and (1) a top surface cleaning processing/a bottom surface cleaning processing, (2) a top surface cleaning (rinsing) processing/a bottom surface cleaning processing, and (3) a top surface drying processing/a bottom surface drying processing are performed in this sequence. Here, a statement of "A processing/B processing" means that the A processing and the B processing are performed in parallel, that is, at least a partially overlapped period (a time period during which the top surface and the bottom surface are processed at the same time) is included in a total time period including a time period during which the top surface is processed and a time period during which the bottom surface is processed. Further, in order to increase or decrease the supply amount of the fluid, the control unit 18 controls the opening/closing valves and the flow rate controllers belonging to the second processing liquid supply device 71, the second drying gas supply device 72 (a second gas supply device), the first processing liquid supply device 73 and the drying gas supply device (a first gas supply device).

FIG. 6A is a schematic diagram illustrating an operational status in (1) the top surface cleaning processing/the bottom surface cleaning processing. In this operation, the wafer W is rotated at a preset rotational speed (e.g., 1000 rpm). Here, as for the top surface, a liquid film is formed on the surface of the wafer W by supplying DIW onto a center of the wafer W from the processing liquid supply nozzle 62, and the surface of the wafer W is physically cleaned by bringing the brush 63 into contact with the top surface of the wafer W and scanning the top surface of the wafer W with the brush 63. Here, the cleaning processing may not be limited to the physical cleaning with the brush 63, but a chemical liquid processing with DHF may be performed instead. Meanwhile, as for the bottom surface, the cleaning processing is performed by supplying DIW onto the center of the wafer W from the processing liquid supply line 43.

FIG. 6B is a schematic diagram illustrating an operational status in (2) the top surface cleaning (rinsing) processing/the bottom surface cleaning processing which is performed after the cleaning processing (1). In this operation, the wafer W is rotated at a preset rotational speed (e.g., 1000 rpm). Here, as for the top surface, the cleaning processing with the brush 63 is stopped, and a cleaning (rinsing) processing is performed by supplying DIW onto the center of the wafer W from the processing liquid supply nozzle 62. Meanwhile, as for the bottom surface, the cleaning processing is performed by supplying the DIW onto the center of the wafer W from the processing liquid supply line 43.

FIG. 6C is a schematic diagram illustrating (3) the top surface drying processing/the bottom surface drying processing performed after the cleaning processing (2). Here, as for the top surface, the drying processing on the top surface is performed by supplying the drying gas ($N_2$) from the gas supply port 61. Further, as for the bottom surface, the drying processing is also performed by supplying the drying gas ($N_2$) from the gas passageway 80.

Figure 7:
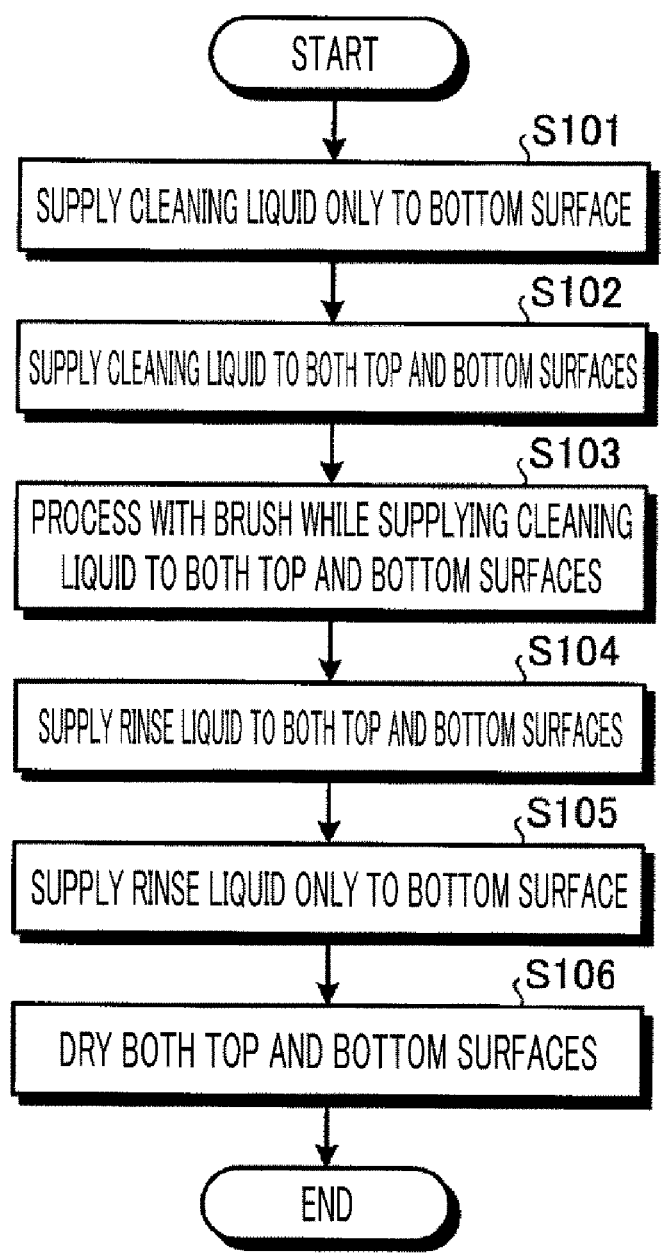
FIG. 7 is a flowchart for describing a control operation for a processing liquid supply device.

Now, a control operation over the first and second processing liquid supply devices 73 and 71 when performing the cleaning processing (1) and the cleaning processing (2) will be discussed with reference to a flowchart of FIG. 7, which describes the control operation over the first and second processing liquid supply devices 73 and 71. Processes of this flowchart is achieved as the control unit 18 executes substrate processing programs stored in the storage unit 19.

First, the above-described cleaning processing (1) is performed on the wafer W. Here, however, a cleaning liquid is not supplied to both surfaces of the wafer W from the beginning. That is, the second processing liquid supply device 71 supplies the cleaning liquid only to the bottom surface (a first starting process), so that a liquid film of the cleaning liquid is formed on the bottom surface of the wafer W (process S101). Here, a supply time of the cleaning liquid is not particularly limited as long as the liquid film can be formed.

Then, the first processing liquid supply device 73 supplies the cleaning liquid onto the top surface of the wafer W (a second starting process). At this time, since the cleaning liquid is being continuously supplied onto the bottom surface of the wafer W, an operation in which the cleaning liquid is supplied to both the top surface and the bottom surface of the wafer W is performed (process S102).

Thereafter, in a state that the liquid film of the cleaning liquid is formed on both surfaces of the wafer W by carrying on the operation of the process S102, the brush 63 is brought into contact with the top surface of the wafer W and then moved, so that the top surface of the wafer W is cleaned (process S103). The processes described so far correspond to the cleaning processing (1).

After the completion of the cleaning processing (1), as the cleaning processing (2), a rinse liquid is supplied on both surfaces of the wafer W (process S104). The supply of the rinse liquid is continued for a time period just enough to remove the cleaning liquid or the particle remaining on the wafer W.

Subsequently, the supply of the rinse liquid onto the top surface by the first processing liquid supply device 73 is stopped (a first ending process), and the second processing liquid supply device 71 supplies the rinse liquid only to the bottom surface (process S105). This processing is continued for a time period enough to remove the processing liquid, remaining on the top surface of the wafer W, from the wafer W by the centrifugal force caused through the rotation thereof.

Then, the supply of the rinse liquid to the bottom surface by the second processing liquid supply device 71 is stopped (a second ending process), and the drying processing (3) is performed (process S106). After the drying processing is finished, the series of the processings is ended.

As stated above, according to the present exemplary embodiment, in the cleaning processing (2), after performing the rinsing processings on the top surface and the bottom surface of the wafer W in parallel while rotating wafer W, when stopping both of the rinsing processings on the top surface and the bottom surface of the wafer W, the supply of the rinse liquid onto the top surface of the wafer W is first stopped, and after that, the supply of the rinse liquid onto the bottom surface of the wafer W is stopped. Accordingly, since the liquid film is still formed on the bottom surface of the wafer W for a time period during which the liquid is being removed from the top surface, it is possible to suppress the contamination of the bottom surface of the wafer W as the device formation surface, which is caused by the introduction of the liquid from the top surface thereto and the mist generated as the liquid collides with the cup and splashes up.

Here, the supply of the rinse liquid to the bottom surface of the wafer W is set to be continued until the rinse liquid remaining on the top surface of the wafer W is removed from the top surface of the wafer W by the centrifugal force caused through the rotation of the wafer W. Accordingly, since the rinse liquid that might be introduced is all removed, the contamination of the bottom surface can be more securely suppressed.

Further, when starting the cleaning processing (1), the supply of the processing liquid to the bottom surface of the wafer W is first begun, and then the supply of the processing liquid onto the top surface of the wafer W is started. Accordingly, even at the beginning of the cleaning processing performed when relatively many contaminants adhere to the surfaces of the wafer W, the introduction of the contaminants from the top surface to the bottom surface can be suppressed.

Furthermore, the periphery portion of the first cleaning body 633 (an example of a cleaning body) of the brush 63 according to the present exemplary embodiment has the outwardly bent shape when viewed from the side. With this shape, a phenomenon that the processing liquid having collided with the brush 63 is turned into the mist by the rotation of the brush 63 can be reduced, so that the contamination of the wafer W with the processing liquid on the top surface can be suppressed.

Further, the groove G provided at the center of each single guide pin 313 and oriented outwards is configured to follow the direction of the liquid flow created at the periphery portion of the wafer W. Accordingly, it is possible to minimize the collision of the liquid flow with the guide pin 313 during the cleaning processing, so that the generation of the mist caused by the splash of the processing liquid can be suppressed.

Moreover, the flow rectifying member 34 is provided within the recovery cup 50, and the base plate 31*a* is set to have a radius larger than that of the wafer W. With this configuration, the blow-up of the mist within the recovery cup 50 can be suppressed, and the adhesion of the mist to the bottom surface of the wafer W can be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus configured to perform a liquid processing on a substrate by supplying a processing liquid onto the substrate, the substrate processing apparatus comprising:
   a substrate holding/rotating unit configured to hold and rotate the substrate;
   a first processing liquid supply device configured to supply the processing liquid onto a top surface of the substrate;
   a second processing liquid supply device configured to supply the processing liquid onto a bottom surface of the substrate; and
   a control unit configured to control processings using the first processing liquid supply device and the second processing liquid supply device,
   wherein, after performing a liquid processing on the top surface of the substrate and a liquid processing on the bottom surface of the substrate in parallel while rotating the substrate by the substrate holding/rotating unit, when stopping the liquid processing on the top surface of the substrate and the liquid processing on the bottom surface of the substrate, the control unit stops a supply of the processing liquid onto the top surface of the substrate by the first processing liquid supply device first, and after that, stops a supply of the processing liquid onto the bottom surface of the substrate by the second processing liquid supply device, wherein the substrate processing apparatus further comprises:

a recovery cup configured to collect the processing liquid scattered from the substrate being rotated;

a gas supply device configured to supply a gas to form a downflow from above the substrate;

a gas exhaust port configured to exhaust an air flow generated as the downflow is introduced into the recovery cup; and a flow rectifying member provided between the substrate holding/rotating unit and the recovery cup and configured to rectify the air flow such that the air flow heads toward the gas exhaust port, wherein the substrate holding/rotating unit comprises a base plate configured to rotate the substrate, an outer peripheral end of the base plate extends past an outer edge portion of the substrate, and an upper end of the flow rectifying member is located at a position lower than the outer peripheral end of the base plate, and when viewed from above, the upper end of the flow rectifying member is radially spaced apart from the outer peripheral end of the base plate.

2. The substrate processing apparatus of claim 1,
wherein the control unit stops the supply of the processing liquid onto the bottom surface of the substrate by the second processing liquid supply device after the supply of the processing liquid onto the top surface of the substrate by the first processing liquid supply device is stopped and a remaining processing liquid thereon is removed from the top surface of the substrate by a centrifugal force generated through a rotation of the substrate.

3. The substrate processing apparatus of claim 1,
wherein, when starting the liquid processing on the top surface of the substrate and the liquid processing on the bottom surface of the substrate, the control unit starts the supply of the processing liquid onto the bottom surface of the substrate by the second processing liquid supply device first, and after that, starts the supply of the processing liquid onto the top surface of the substrate by the first processing liquid supply device.

4. The substrate processing apparatus of claim 2,
wherein, when starting the liquid processing on the top surface of the substrate and the liquid processing on the bottom surface of the substrate, the control unit starts the supply of the processing liquid onto the bottom surface of the substrate by the second processing liquid supply device first, and after that, starts the supply of the processing liquid onto the top surface of the substrate by the first processing liquid supply device.

5. The substrate processing apparatus of claim 1,
wherein the substrate holding/rotating unit comprises:

a supporting member provided on the base plate and configured to support the substrate; and a guide pin provided on the supporting member and configured to guide the substrate, which is transferred from an outside of the apparatus, to a position where the substrate is supported by the supporting member, wherein when an edge of the substrate comes into contact with the guide pin, the substrate slides to the supporting member by the guide pin, wherein the guide pin has a groove extended in a direction intersecting with a periphery of the base plate, and the groove is inclined toward a direction of the processing liquid flowing on a periphery of the substrate during the liquid processing.

* * * * *